United States Patent
Fuchigami

(10) Patent No.: US 12,043,188 B2
(45) Date of Patent: Jul. 23, 2024

(54) WIRE HARNESS FOR SUPPRESSING VIBRATION OF AN ELECTROMAGNETIC WAVE ABSORBING MEMBER

(71) Applicant: SUMITOMO WIRING SYSTEMS, LTD., Yokkaichi (JP)

(72) Inventor: Masahiro Fuchigami, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 17/769,567

(22) PCT Filed: Apr. 9, 2020

(86) PCT No.: PCT/JP2020/015937
§ 371 (c)(1),
(2) Date: Apr. 15, 2022

(87) PCT Pub. No.: WO2021/079544
PCT Pub. Date: Apr. 29, 2021

(65) Prior Publication Data
US 2024/0123920 A1 Apr. 18, 2024

(30) Foreign Application Priority Data
Oct. 23, 2019 (JP) ................. 2019-192737

(51) Int. Cl.
*B60R 16/02* (2006.01)
*H01B 7/00* (2006.01)
*H01B 13/012* (2006.01)

(52) U.S. Cl.
CPC ....... *B60R 16/0215* (2013.01); *H01B 7/0045* (2013.01); *H01B 13/01209* (2013.01)

(58) Field of Classification Search
CPC .............. B60R 16/0215; H01B 7/0045; H01B 13/01209
USPC ......................................... 174/72 A
See application file for complete search history.

(56) References Cited

U.S. PATENT DOCUMENTS

| | | | |
|---|---|---|---|
| 6,054,649 A * | 4/2000 | Uchida | H01B 11/16 336/175 |
| 9,345,179 B2 * | 5/2016 | Imahori | H05K 9/0066 |
| 2015/0289423 A1* | 10/2015 | Imahori | B60L 50/51 307/10.1 |
| 2018/0233263 A1* | 8/2018 | Mizutani | H01F 17/06 |

FOREIGN PATENT DOCUMENTS

| | | |
|---|---|---|
| JP | 2011-138740 A | 7/2011 |
| JP | 2014-130886 A | 7/2014 |
| JP | 2017-038353 A | 2/2017 |

OTHER PUBLICATIONS

Jun. 23, 2020 Search Report issued in International Patent Application No. PCT/JP2020/015937.

* cited by examiner

*Primary Examiner* — Timothy J Thompson
*Assistant Examiner* — Michael F McAllister
(74) *Attorney, Agent, or Firm* — Oliff PLC

(57) ABSTRACT

A wire harness including: a first conductive path; a second conductive path provided side-by-side with the first conductive path; an electromagnetic wave absorber provided on a portion of the first conductive path in a length direction of the first conductive path; and a fixing member configured to fix the first conductive path to the second conductive path in a region of the first conductive path where the electromagnetic wave absorber is installed.

11 Claims, 7 Drawing Sheets

WIRE HARNESS FOR SUPPRESSING VIBRATION OF AN ELECTROMAGNETIC WAVE ABSORBING MEMBER

BACKGROUND

This disclosure relates to a wire harness.

Conventionally, wire harnesses, which are provided with wires that electrically connect a plurality of electrical devices and electromagnetic wave absorbing members that absorb electromagnetic waves (electromagnetic noise) emitted from the wires, are known as wire harnesses that are mounted in vehicles such as hybrid vehicles and electric vehicles. As a result of inserting a wire into a through-hole in an electromagnetic wave absorbing member constituted by a ferrite core, the electromagnetic wave absorbing member is provided on an outer circumference of the wire in a wire harness of this type (see JP 2014-130886A, for example).

SUMMARY

Incidentally, with the above-described wire harness, as the electromagnetic waves, which need to be reduced, increase in size, the size of the electromagnetic wave absorbing member increases. When a wire is inserted into such a large electromagnetic wave absorbing member, there is a risk that the electromagnetic wave absorbing member may vibrate due to vibration caused by the traveling of a vehicle, for example, and the wire may be shaken by the vibration of the electromagnetic wave absorbing member, and the wire may be imp aired.

An exemplary aspect of the disclosure provides a wire harness capable of suppressing vibration of an electromagnetic wave absorbing member.

A wire harness according to this disclosure includes a first conductive path, a second conductive path provided side-by-side with the first conductive path, an electromagnetic wave absorber provided on a portion of the first conductive path in a length direction of the first conductive path, and a fixing member that fixes the first conductive path to the second conductive path in a region of the first conductive path where the electromagnetic wave absorber is installed.

A wire harness according to this disclosure achieves the effect of being able to suppress vibration of an electromagnetic wave absorber.

DETAILED DESCRIPTION OF EMBODIMENTS

Figure 1:
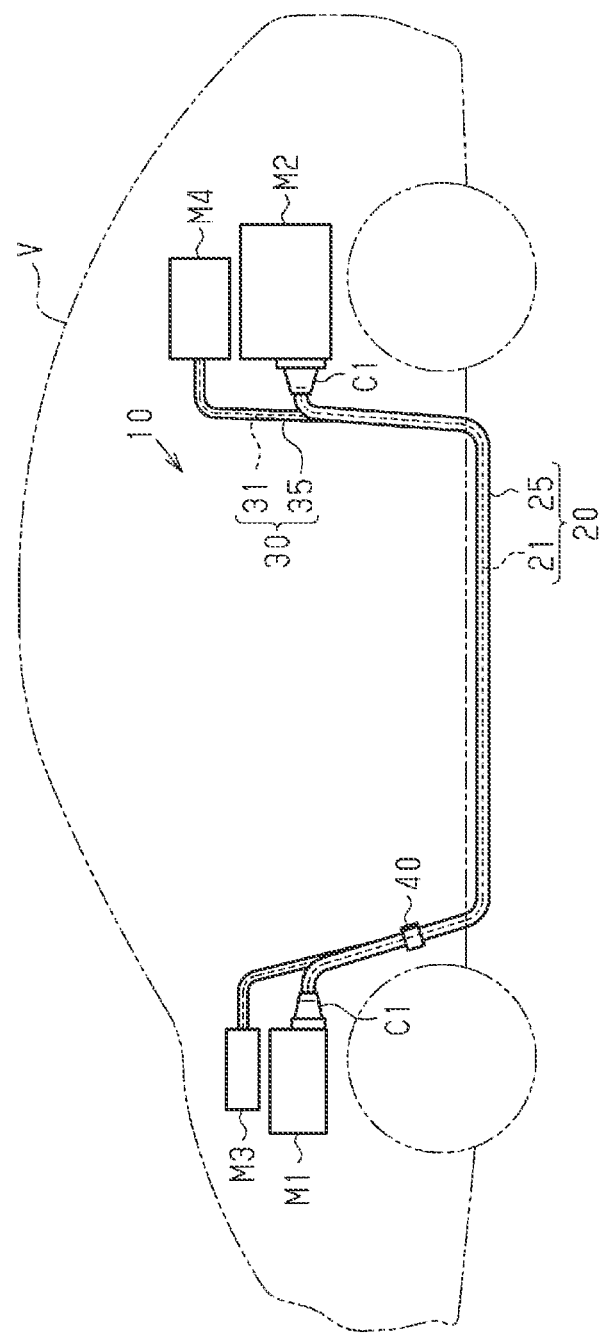
FIG. 1 is a schematic configuration diagram showing a wire harness according to an embodiment.

Description of Embodiments of the Present Disclosure

First, embodiments of this disclosure will be described below.

[1] A wire harness according to this disclosure includes a first conductive path, a second conductive path provided side-by-side with the first conductive path, an electromagnetic wave absorbing member provided on a portion of the first conductive path in a length direction of the first conductive path, and a fixing member configured to fix the first conductive path to the second conductive path in a region of the first conductive path where the electromagnetic wave absorbing member is installed.

According to this configuration, the first conductive path provided with the electromagnetic wave absorbing member is fixed to the second conductive path by the fixing member in the region where the electromagnetic wave absorbing member is installed. Accordingly, the first conductive path and the second conductive path provided side-by-side with the first conductive path are integrated in the region where the electromagnetic wave absorbing member. Therefore, the electromagnetic wave absorbing member can be held by the first conductive path and the second conductive path. As a result, it is possible to more stably hold the electromagnetic wave absorbing member compared to a case where the electromagnetic wave absorbing member is held by only the first conductive path. Therefore, it is possible to suppress vibration of the electromagnetic wave absorbing member due to vibration caused by traveling of a vehicle, and to suppress impairment of the first conductive path due to the vibration of the electromagnetic wave absorbing member.

Here, the "region where the electromagnetic wave absorbing member is installed" in this specification refers to a region where vibration of the electromagnetic wave absorbing member can be suppressed due to the first conductive path being fixed to the second conductive path. The "region where the electromagnetic wave absorbing member is installed" in this specification includes a region located in the vicinity of the electromagnetic wave absorbing member. Here, "vicinity" in this specification indicates that "the vicinity of A" refers to a surrounding region of A and may or may not include A, and if "the vicinity of A" does not include A, "the vicinity of A" refers to a range within a length (3×L1) that is three times the length L1 of the electromagnetic wave absorbing member in the length direction from the end of A, for example.

[2] The second conductive path preferably has a higher rigidity than the first conductive path. According to this configuration, the first conductor can be integrated with the second conductive path, which has a higher rigidity than the first conductive path. Accordingly, the electromagnetic wave absorbing member can be held by the second conductive path with a high rigidity, and thus it is possible to more stably hold the electromagnetic wave absorbing member. Accordingly, it is possible to further suppress vibration of the electromagnetic wave absorbing member due to vibration caused by traveling of a vehicle, and to further suppress impairment of the first conductive path due to the vibration of the electromagnetic wave absorbing member.

[3] It is preferable that the wire harness further includes a first clamp for vehicle body fixing that is provided on the second conductive path or the first conductive path, and the fixing member is provided in the vicinity of the first clamp.

According to this configuration, the fixing member for fixing the first conductive path to the second conductive path is provided in the vicinity of the first clamp for vehicle body fixing, which is provided on the second conductive path or the first conductive path. Accordingly, the first conductive path is integrated with the second conductive path in the vicinity of the first clamp. Therefore, the first conductive path and the second conductive path can be fixed to the vehicle body by the first clamp provided on one of the first conductive path and the second conductive path. As a result, the number of components can be reduced compared to a case where clamps are provided on both the first conductive path and the second conductive path. Also, the electromagnetic wave absorbing member can be more stably held by a fixing force of the first clamp to the vehicle body. Accordingly, it is possible to further suppress vibration of the electromagnetic wave absorbing member due to vibration caused by traveling of a vehicle, and to further suppress impairment of the first conductive path due to the vibration of the electromagnetic wave absorbing member.

[4] It is preferable that the wire harness further includes a second clamp that is provided on the second conductive path or the first conductive path and is provided away from the first clamp in the length direction of the first conductive path, and the fixing member is provided between the first clamp and the second clamp in the length direction of the first conductive path.

According to this configuration, the fixing member for fixing the first conductive path to the second conductive path is provided between the first clamp for vehicle body fixing provided on the second conductive path or the first conductive path and the second clamp for vehicle body fixing provided on the second conductive path or the first conductive path. Accordingly, the first conductive path is integrated with the second conductive path between the first clamp and the second clamp. Therefore, both the first conductive path and the second conductive path can be fixed to the vehicle body by the first clamp provided on one of the first conductive path and the second conductive path and the second clamp provided on one of the first conductive path and the second conductive path. As a result, the number of components can be reduced compared to a case where a pair of clamps are provided on both the first conductive path and the second conductive path. Also, the electromagnetic wave absorbing member can be more stably held by the fixing force of the first clamp and the second clamp to the vehicle body. Accordingly, it is possible to further suppress vibration of the electromagnetic wave absorbing member due to vibration caused by traveling of a vehicle, and to further suppress impairment of the first conductive path due to the vibration of the electromagnetic wave absorbing member.

[5] It is preferable that the electromagnetic wave absorbing member is provided between the first clamp and the second clamp in the length direction of the first conductive path, and is provided toward the first clamp side, out of the first clamp and the second clamp.

According to this configuration, the electromagnetic wave absorbing member is provided between the first clamp and the second clamp, and thus the electromagnetic wave absorbing member can be more stably held by the fixing force of the first clamp and the second clamp to the vehicle body. Also, the electromagnetic wave absorbing member is provided toward the first clamp side, out of the first clamp and the second clamp. Accordingly, the electromagnetic wave absorbing member can be provided at a position close to the point fixed by the first clamp, and thus it is possible to more stably hold the electromagnetic wave absorbing member.

[6] It is preferable that the wire harness further includes a connector connected to an end portion of the first conductive path, and the fixing member is provided between the first clamp and the connector in the length direction of the first conductive path.

According to this configuration, the fixing member for fixing the first conductive path to the second conductive path is provided between the first clamp for vehicle body fixing, which is provided on the second conductive path or the first conductive path and the connector. Accordingly, the first conductive path is integrated with the second conductive path between the first clamp and the connector. Therefore, it is possible to suppress vibration of the electromagnetic wave absorbing member caused by traveling of the vehicle or the like between the first clamp and the connector. Thus, it is possible to suppress impairment of the connector due to the vibration of the electromagnetic wave absorbing member.

[7] It is preferable that the electromagnetic wave absorbing member is provided on an outer circumference of the first conductive path, and the fixing member is formed so as to fix the electromagnetic wave absorbing member to the second conductive path.

According to this configuration, the first conductive path is fixed to the second conductive path via the electromagnetic wave absorbing member due to the electromagnetic wave absorbing member being fixed to the second conductive path by the fixing member. Accordingly, it is possible to hold the electromagnetic wave absorbing member in a state in which the electromagnetic wave absorbing member is sandwiched between the first conductive path and the second conductive path. As a result, it is possible to more stably hold the electromagnetic wave absorbing member.

[8] It is preferable that the fixing member is formed so as to cover an outer circumferential surface of the electromagnetic wave absorbing member, and the fixing member has a cushioning layer on an outer surface thereof.

According to this configuration, the outer circumferential surface of the electromagnetic wave absorbing member is covered by the cushioning layer of the fixing member, and thus, the cushioning layer can be interposed between the outer circumferential surface of the electromagnetic wave absorbing member and a peripheral component thereof, for example. Accordingly, it is possible to suppress direct contact between the electromagnetic wave absorbing member and the peripheral component, and thus to suppress the occurrence of abnormal noise caused by contact between the electromagnetic wave absorbing member and the peripheral component. Also, because the fixing member has the cushioning layer, it is possible to further reduce the number of components compared to a case where the fixing member and the cushioning layer are constituted by separate components.

[9] The fixing member is preferably a tape member having an adhesive layer. According to this configuration, the fixing member is constituted by a tape member having an adhesive layer, and thus the fixing member can be wound around the outer circumferential surface of the second conductive path or the like while the fixing member is adhered thereto by the adhesive layer. This makes it possible to improve the operability of assembling the wire harness.

[10] It is preferable that the electromagnetic wave absorbing member includes a ring-shaped magnetic core having a through-hole through which the first conductive path is passed, and a ring-shaped case that is configured to accommodate the magnetic core and has a through-hole through which the first conductive path is passed. According to this configuration, the magnetic core is accommodated in the case, and thus it is possible to suppress impairment due to the magnetic core coming into contact with the peripheral component.

Here, a "ring" in this specification includes a circular ring whose outer edge has a circular shape, a ring whose outer edge has an elliptical or oval shape, a polygonal ring whose outer edge has a polygonal shape, and a ring whose outer edge has a rounded polygonal shape, and a "ring" refers to any ring whose outer edge has any closed shape connected by straight lines or curved lines. A "ring" includes a ring with a shape having a through-hole in a plan view, and a shape whose outer edge has the same shape as the inner circumferential shape of the through-hole and a shape whose outer edge has a shape that is different from the inner circumferential shape of the through-hole. A "ring" includes a ring with a shape that has a predetermined length extending in a direction in which the through-hole passes therethrough, and the magnitude of the length thereof is not limited. Also, a "ring shape" in this specification need only be regarded as a ring overall, and includes a shape that includes a notch or the like in a portion thereof, such as a C-shape.

[11] It is preferable that the first conductive path includes one or more first wires and a first outer cover member that encloses an outer circumference of the first wires, the second conductive path includes one or more second wires and a second outer cover member that encloses an outer circumference of the second wires, and the electromagnetic wave absorbing member is provided on an outer circumference of the first outer cover member.

According to this configuration, the electromagnetic wave absorbing member is provided on the outer circumference of the first outer cover member that encloses the outer circumference of the first wires. Therefore, it is possible to inhibit the electromagnetic wave absorbing member from coming into direct contact with the outer circumferential surface of the first wires. Accordingly, it is possible to suitably suppress impairment of the first wires due to the contact between the first wires and the electromagnetic wave absorbing member. Also, because the outer circumference of the second wires is enclosed by the second outer cover member, it is possible to inhibit the electromagnetic wave absorbing member from coming into direct contact with the outer circumferential surface of the second wires. Accordingly, it is possible to suitably suppress impairment of the second wires due to the contact between the second wires and the electromagnetic wave absorbing member.

Details of Embodiments of the Present Disclosure

A specific example of a wire harness according to this disclosure will be described with reference to the drawings below. In the drawings, some of the components may be exaggerated or simplified for the sake of description. Also, the dimensional proportions of some parts may differ from their actual proportions. Note that the present disclosure is not limited to these examples, but is indicated by the claims, and all changes that come within the meaning and range of equivalency of the claims are intended to be embraced therein.

Overall Configuration of Wire Harness 10

A wire harness 10 shown in FIG. 1 electrically connects two electrical apparatuses (devices), or three or more electrical apparatuses (devices). The wire harness 10 is mounted in a vehicle V such as a hybrid vehicle or an electric vehicle, for example. The wire harness 10 includes a conductive path 20 that electrically connects a device M1 and a device M2, a conductive path 30 that electrically connects a device M3 and a device M4, and an electromagnetic wave absorbing member 40 (electromagnetic wave absorber).

The conductive path 20 is routed from the device M1 to the device M2 in a state in which a portion of the conductive path 20 in the length direction passes under the floor of the vehicle V, for example. An example of the device M1 is an inverter installed in the vicinity of a front portion of the vehicle V, and an example of the device M2 is a high-voltage battery installed in the vehicle V rearward of the device M1. The device M1 serving as an inverter is connected to a wheel driving motor (not shown), which serves as a power source for driving the vehicle, for example. The inverter generates AC power from DC power that is supplied from the high-voltage battery, and supplies the AC power to the motor. The device M2 serving as a high-voltage battery is a battery that can supply a voltage of several hundred volts, for example. That is, the conductive path 20 of this embodiment forms a high-tension circuit that enables high-voltage exchange between the high-voltage battery and the inverter.

The conductive path 30 is routed from the device M3 to the device M4 in a state in which a portion of the conductive path 30 in the length direction passes under the floor of the vehicle V, for example. An example of the device M3 is a relay box installed in the vicinity of a front portion of the vehicle V, and an example of the device M4 is a low-voltage battery installed in the vicinity of a rear portion of the vehicle V. The device M3 serving as the relay box distributes the voltage supplied from the low-voltage battery to various devices mounted in the vehicle V. The device M4 serving as the low-voltage battery is a battery that can supply a voltage (e.g., 12 volts) that is lower than the above-described high-voltage battery. That is, the conductive path 30 of this embodiment forms a low-tension circuit that can handle a low voltage supplied from the low-voltage battery.

The wire harness 10 includes a parallel wiring portion routed such that the conductive path 20 and the conductive path 30 extend in parallel with each other, and an individual wiring portion routed such that the conductive path 20 and the conductive path 30 extend in directions that are different from each other, for example.

Figure 2:
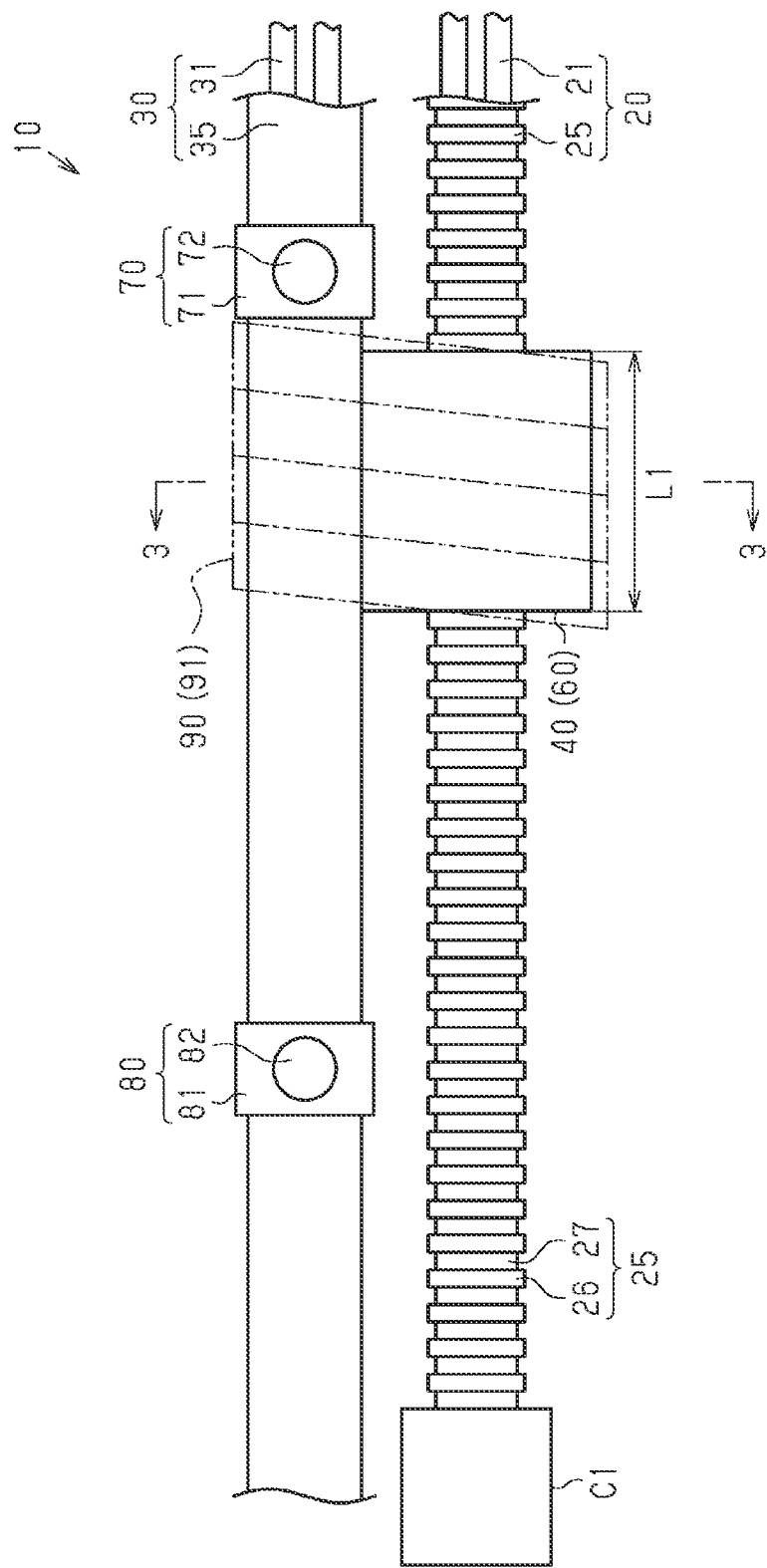
FIG. 2 is a schematic plan view showing a wire harness according to an embodiment.

As shown in FIG. 2, the conductive path 20 and the conductive path 30 are arranged side-by-side in the parallel wiring portion. The conductive path 20 and the conductive path 30 are provided so as to extend parallel to each other in the parallel wiring portion, for example. A portion of the parallel wiring portion in the length direction thereof is routed under the floor of the vehicle V, for example. The conductive paths 20 and 30 are each formed so as to be bent into a two-dimensional shape or three-dimensional shape in accordance with the set wiring route. Here, "parallel" in this specification includes not only strictly parallel but also generally parallel in a range in which the effects of this embodiment are achieved.

Configuration of Conductive Path 20

As shown in FIG. 1, the conductive path 20 includes one or more (two in the embodiment) wires 21, a pair of connectors C1 respectively attached to two end portions of the wires 21, and an outer cover member 25 collectively enclosing the plurality of wires 21. End portions on one side of the wires 21 are connected to the device M1 via one of the connectors C1, and end portions on the other side of the wires 21 are connected to the device M2 via the other connector C1. Each wire 21 is elongated to extend in the front-rear direction of the vehicle V, for example. Each wire 21 is formed so as to be bent into a two-dimensional shape or three-dimensional shape in accordance with the wiring route of the wire harness 10, for example. The wires 21 in this embodiment are high-voltage wires that can handle high voltages and large currents, for example. The wires 21 may be shielded wires that have an electromagnetically shielded structure, or may be non-shielded wires that have no electromagnetically shielded structure.

Configuration of Wire 21

Figure 3:
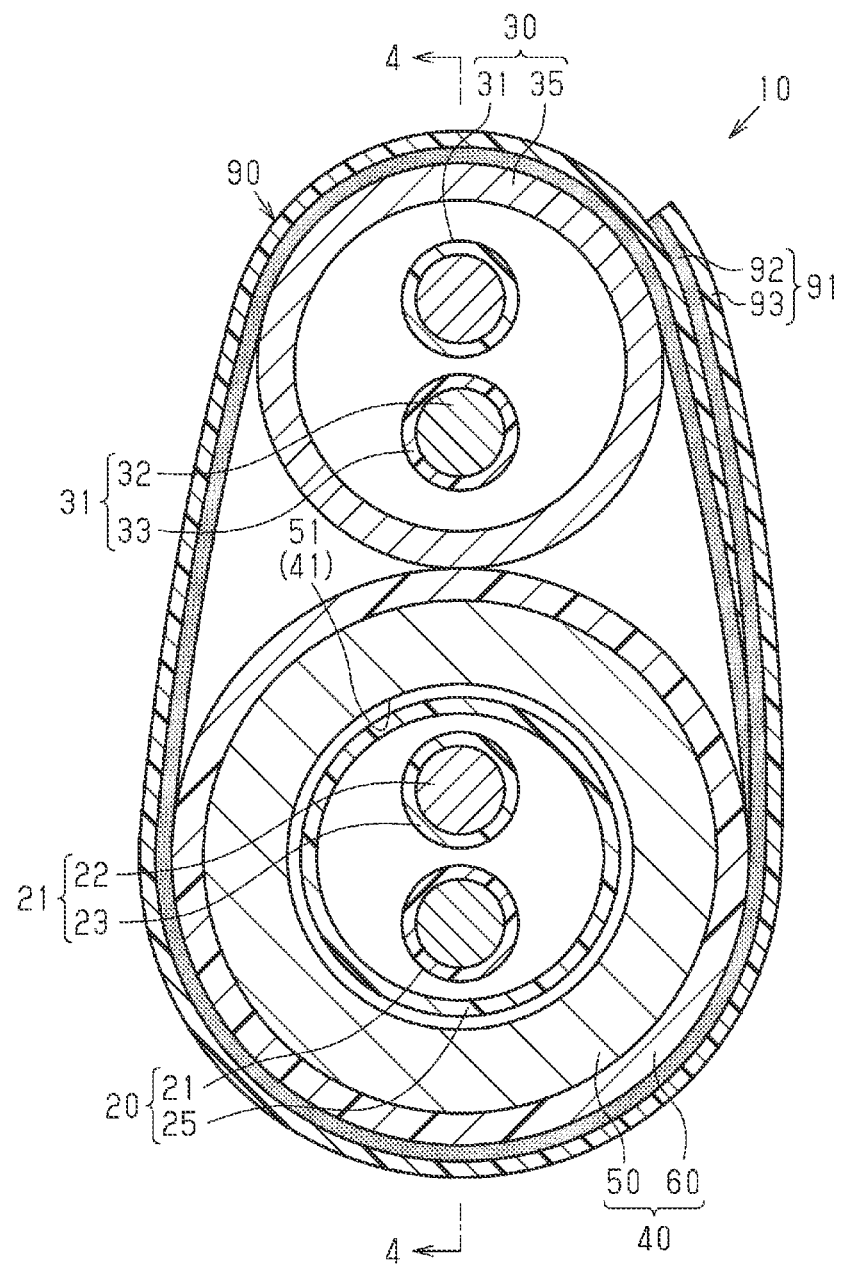
FIG. 3 is a schematic transverse cross-sectional view (a cross-sectional view taken along line 3-3 in FIG. 2) showing a wire harness according to an embodiment.

As shown in FIG. 3, the wires 21 are coated wires each including a core wire 22 formed by a conductor and an insulating sheath 23 that covers the outer circumference of the core wire 22. A twisted wire obtained by twisting a plurality of bare metal wires together, a columnar conductor constituted by one columnar metal rod that is solid, or a tubular conductor that is hollow can be used as the core wire 22, for example. A twisted wire, a columnar conductor, and a tubular conductor may be used in combination as the core wire 22, for example. Examples of the columnar conductor include a single core wire and a bus bar. The core wires 22 in this embodiment are twisted wires. A metallic material such as a copper-based material or an aluminum-based material can be used as the material of the core wires 22, for example.

Configuration of Core Wire 22

The cross-sectional shape (i.e., a transverse cross-sectional shape) obtained by cutting a core wire 22 along a plane orthogonal to the length direction of the core wire 22 may be any shape. The transverse cross-sectional shape of each core wire 22 is a circular, semicircular, polygonal, square, or flat shape, for example. The transverse cross-sectional shape of the core wire 22 in this embodiment is a circular shape.

Configuration of Insulating Sheath 23

The insulating sheaths 23 respectively cover the entire outer circumferential surfaces of the core wires 22, for example. The insulating sheath 23 is made of an insulating material such as a synthetic resin, for example. It is possible to use a synthetic resin containing polyolefin-based resin as a main component, such as crosslinked polyethylene or crosslinked polypropylene, as the material of the insulating sheath 23, for example. Materials of one or more types can be used alone or in combination of two or more as the material of the insulating sheath 23. The insulating sheath 23 can be formed through, for example, extrusion molding (extrusion coating) performed on the core wire 22.

Configuration of Outer Cover Member 25

The outer cover member 25 has an overall elongated tubular shape. The outer cover member 25 in this embodiment is formed in a cylindrical shape. The wires 21 are accommodated in an internal space of the outer cover member 25. A metal pipe or resin pipe, a resin protector, a flexible corrugated tube made of resin or the like, a waterproof rubber cover, or a combination thereof may be used as the outer cover member 25, for example. A metallic material such as a copper-based material, an iron-based material, or an aluminum-based material can be used as the material of a metal pipe. A conductive resin material or a resin material that has no conductivity can be used as the material of a resin protector or a resin corrugated tube, for example. It is possible to use a synthetic resin such as polyolefin, polyamide, polyester, or an ABS resin, as this resin material, for example.

As shown in FIG. 2, the outer cover member 25 in this embodiment is a corrugated tube made of a synthetic resin. The outer cover member 25 is provided so as to enclose the entire outer circumference of the plurality of the wires 21 in the circumferential direction, for example. The outer cover member has an accordion structure in which ring-shaped protrusions 26 and ring-shaped recesses 27 are arranged alternatingly in the length direction, for example.

Configuration of Conductive Path 30

As shown in FIG. 1, the conductive path 30 includes one or more (two in the embodiment) wires 31, and an outer cover member 35 enclosing the outer circumference of the wires 31, for example. End portions on one side of the wires 31 is connected to the device M3, and end portions on the other side of the wires 31 is connected to the device M4, for example. Each wire 31 is elongated to extend in the front-rear direction of the vehicle V, for example. Each wire 31 is formed so as to be bent into a two-dimensional shape or three-dimensional shape in accordance with the wiring route of the wire harness 10, for example. The wires 31 in this embodiment are low-voltage wires that can handle low voltages, for example. The wires 31 may be shielded wires that have an electromagnetically shielded structure, or may be non-shielded wires that have no electromagnetically shielded structure.

Configuration of Wire 31

As shown in FIG. 3, the wires 31 are coated wires each including a core wire 32 formed by a conductor and an insulating sheath 33 that covers the outer circumference of the core wire 32. A twisted wire, a columnar conductor, a tubular conductor, or the like may be used as the core wire 32, for example. A twisted wire, a columnar conductor, and a tubular conductor may be used in combination as the core wire 32, for example. Examples of the columnar conductor include a single core wire and a bus bar. The core wires 32 in this embodiment are twisted wires. A metallic material such as a copper-based material or an aluminum-based material can be used as the material of the core wires 32, for example.

Configuration of Core Wire 32

The transverse cross-sectional shape of the core wire 32 may be any shape. The transverse cross-sectional shape of the core wire 32 is a circular, semicircular, polygonal, square, or flat shape, for example. The transverse cross-sectional shape of the core wire 32 in this embodiment is a circular shape.

Configuration of Insulating Sheath 33

The insulating sheaths 33 respectively cover the entire outer circumferential surfaces of the core wires 32 in the circumferential direction, for example. The insulating sheath 33 is made of an insulating material such as a synthetic resin, for example. It is possible to use a synthetic resin containing polyolefin-based resin as a main component, such as crosslinked polyethylene or crosslinked polypropylene, as the material of the insulating sheath 33, for example. Materials of one or more types can be used alone or in combination of two or more as appropriate as the material of the insulating sheath 33. The insulating sheath 33 can be formed through, for example, extrusion molding (extrusion coating) performed on the core wire 32.

Configuration of Outer Cover Member 35

The outer cover member 35 has an overall elongated tubular shape. The outer cover member 35 in this embodiment is formed in a cylindrical shape. The wires 31 are accommodated in an internal space of the outer cover member 35. A metal pipe or resin pipe, a resin protector, a flexible corrugated tube made of resin or the like, a waterproof rubber cover, or a combination thereof may be used as the outer cover member 35, for example. The outer cover member 35 in this embodiment is a metal pipe having a higher rigidity than the wires 31. The outer cover member 35 has a higher flexural rigidity than the wires 31, for example. The outer cover member 35 has a higher flexural rigidity than the outer cover member 25 (a corrugated tube), for example. The outer circumferential surface of the outer cover member 35 is a smooth surface, for example.

It is possible to use a material whose mechanical strength (rigidity, hardness, and the like) is higher than that of the material constituting the outer cover member 25, as the material of the outer cover member 35, for example. A metallic material such as a copper-based material, an iron-based material, or an aluminum-based material can be used as the material of the outer cover member 35, for example. The outer cover member 35 in this embodiment has a protecting function to protect the wires 31 from flying objects and water droplets, and has an electromagnetic shield function to protect the wires 31 from electromagnetic waves.

Configuration of Conductive Paths 20 and 30

The conductive path 30 has a higher rigidity than the conductive path 20, for example. Because the outer cover member 35 has a higher rigidity than the outer cover member 25, the conductive path 30 has a higher rigidity than the conductive path 20, for example. The rigidity of the outer cover member 35 is increased using the following method, for example. The outer cover member 35 is composed of a material whose mechanical strength is higher than that of the material constituting the outer cover member 25, for example. The dimension of the outer circumference of the outer cover member 35 is set larger than the dimension of the outer circumference of the outer cover member 25, for example. The outer diameter of the outer cover member 35 is set larger than the outer diameter of the outer cover member 25 in this embodiment. The thickness of the outer cover member 35 (i.e., the dimension thereof extending in the radial direction) is larger than the thickness of the outer cover member 25, for example.

Configuration of Wire Harness 10

As shown in FIG. 2, the wire harness 10 includes the electromagnetic wave absorbing member 40 provided on the conductive path 20, clamps 70 and 80 that fix the conductive path 30 to the vehicle body of the vehicle V (see FIG. 1), and a fixing member 90 that fixes the conductive path 20 to the conductive path 30, for example.

Configuration of Electromagnetic Wave Absorbing Member 40

The electromagnetic wave absorbing member 40 is provided on a portion of the conductive path 20 in the length direction of the conductive path 20. The electromagnetic wave absorbing member 40 is provided on portions of the wires 21 in the length direction of the wires 21. The electromagnetic wave absorbing member 40 is provided on the conductive path 20 in the parallel wiring portion where the conductive path 20 and the conductive path 30 are routed in parallel with each other, for example. The electromagnetic wave absorbing member 40 is provided on the outer circumference of the outer cover member 25, for example. The electromagnetic wave absorbing member 40 is provided so as to enclose the entire outer circumference of the outer cover member 25 in the circumferential direction, for example. The electromagnetic wave absorbing member 40 is provided so as to collectively enclose the outer circumference of the plurality of wires 21, for example. The electromagnetic wave absorbing member 40 absorbs some of the electromagnetic waves (electromagnetic noise) emitted from the wires 21, for example.

Note that, in the following description, when a direction is simply mentioned as the "length direction", the length direction refers to a direction in which the central axis of the wire 21 extends, and when a direction is simply mentioned as the "circumferential direction", the circumferential direction refers to a circumferential direction of the central axis of the wire 21. Also, in the following description, when a direction is simply mentioned as the "radial direction", the radial direction refers to the radial direction of the central axis of the wire 21.

The electromagnetic wave absorbing member 40 is provided in the vicinity of the clamp 70 provided on the conductive path 30 in the length direction of the conductive paths 20 and 30, for example. Here, "vicinity" in this specification indicates that "the vicinity of A" refers to a surrounding region of A and may or may not include A, and if "the vicinity of A" does not include A, "the vicinity of A" refers to a range within a length (3×L1) that is three times the length L1 of the electromagnetic wave absorbing member 40 in the length direction from the end of A, for example. The electromagnetic wave absorbing member 40 in this embodiment is provided away from the clamp 70 in the length direction of the conductive paths 20 and 30. The electromagnetic wave absorbing member 40 is provided in a region within a length (3×L1) from the end of the clamp 70, for example.

The electromagnetic wave absorbing member 40 is provided between the clamp 70 and the clamp 80 in the length direction of the conductive paths 20 and 30, for example. The electromagnetic wave absorbing member 40 is provided toward the clamp 70 side, out of the clamps 70 and 80 in the length direction of the conductive paths 20 and 30, for example. The electromagnetic wave absorbing member 40 is provided between the clamp 70 and the connector C1 in the length direction of the conductive paths 20 and 30, for example. The electromagnetic wave absorbing member 40 is provided toward the clamp 70 side, out of the clamp 70 and the connector C1 in the length direction of the conductive paths 20 and 30, for example.

Figure 4:
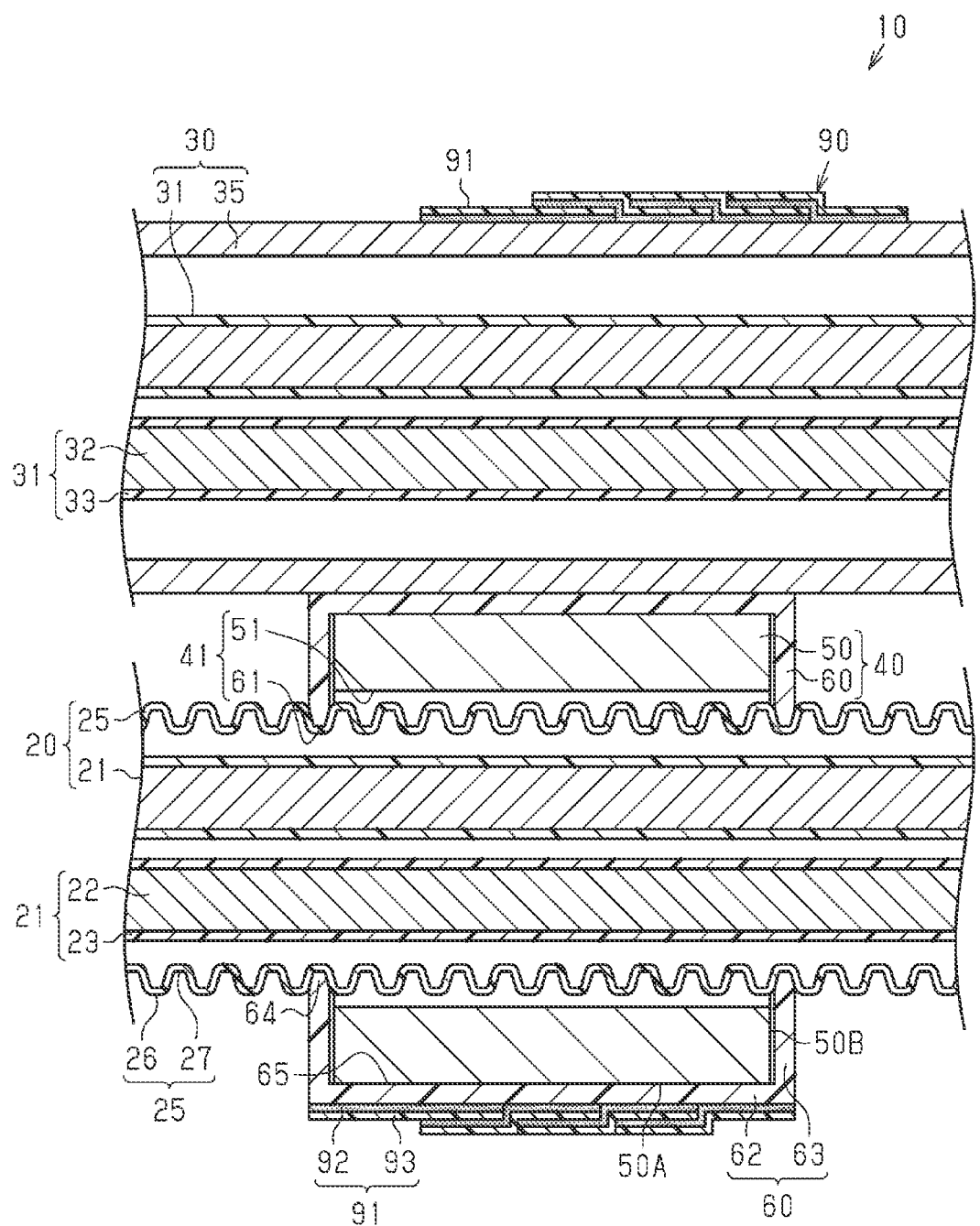
FIG. 4 is a schematic cross-sectional view (a cross-sectional view taken along line 4-4 in FIG. 3) showing a wire harness according to an embodiment.

As shown in FIG. 4, the electromagnetic wave absorbing member 40 has a through-hole 41 through which the plurality of wires 21 collectively pass, for example. The electromagnetic wave absorbing member 40 has a ring shape due to having the through-hole 41, for example. The through-hole 41 is formed so as to pass through the electromagnetic wave absorbing member 40 in the length direction of the wires 21, for example. The plurality of wires 21 are provided so as to pass through the through-hole 41, for example. The outer cover member 25 is provided so as to pass through the through-hole 41 in a state in which the outer cover member 25 collectively encloses the outer circumference of the plurality of wires 21, for example.

Here, a "ring" in this specification includes a circular ring whose outer edge has a circular shape, a ring whose outer edge has an elliptical or oval shape, a polygonal ring whose outer edge has a polygonal shape, and a ring whose outer edge has a rounded polygonal shape, and a "ring" refers to any ring whose outer edge has any closed shape connected by straight lines or curved lines. A "ring" includes a ring with a shape having a through-hole in a plan view, and a shape whose outer edge has the same shape as the inner circumferential shape of the through-hole and a shape whose outer edge has a shape that is different from the inner circumferential shape of the through-hole. A "ring" includes a ring that has a predetermined length extending in a direction in which the through-hole passes therethrough, and the magnitude of the length thereof is not limited. Also, a "ring shape" in this specification need only be regarded as a ring overall, and includes a shape that includes a notch or the like in a portion thereof, such as a C-shape. The electromagnetic wave absorbing member 40 has the through-hole 41 in a plan view when viewed in the length direction of the wires 21, and has a ring shape having a predetermined length extending in the direction in which the through-hole 41 passes therethrough, for example.

The electromagnetic wave absorbing member 40 includes a ring-shaped magnetic core 50 and a ring-shaped case 60 that accommodates the magnetic core 50, for example. The magnetic core 50 has a through-hole 51 through which the plurality of wires 21 collectively pass. The case 60 has a through-hole 61 through which the plurality of wires 21 collectively pass. The through-hole 41 in the electromagnetic wave absorbing member 40 is constituted by the through-hole 51 and the through-hole 61.

Configuration of Magnetic Core 50

The magnetic core 50 has a ring shape due to having the through-hole 51, for example. The magnetic core 50 has a ring shape in which two ends of the magnetic core 50 in the length direction of the wires 21 are open, for example. The magnetic core 50 in this embodiment has a circular ring shape. The through-hole 51 is formed so as to pass through the magnetic core 50 in the length direction, for example.

Because the magnetic core 50 is disposed so as to face the wires 21 over the entire circumference of the wires 21 in the circumferential direction, the magnetic core 50 functions to reduce electromagnetic waves emitted from the wires 21, for example. The magnetic core 50 absorbs electromagnetic waves emitted from the wires 21, and converts the energy of the electromagnetic waves into mechanical energy such as vibration or thermal energy, for example. This reduces the adverse effects of the magnetic waves emitted from the wires 21 on peripheral devices and the like.

Here, "facing" in this specification refers to surfaces or members being located in front of each other, and not only a case where surfaces or members are located completely in front of each other but also a case where they are located partially in front of each other. Also, "facing" in this specification includes a case where a member other than two portions is interposed between the two portions, and a case where nothing is interposed between the two portions.

The magnetic core 50 is a molded body containing a soft magnetic material, for example. Examples of the soft magnetic material include iron (Fe), an iron alloy, and ferrite. Examples of the iron alloys include Fe-silicon (Si) alloys and Fe-nickel (Ni) alloys. A ferrite core, an amorphous core, or a permalloy core can be used as the magnetic core 50, for example. The ferrite core is made of soft ferrite exhibiting soft magnetism, for example. Examples of the soft ferrite include ferrite containing nickel (Ni) and zinc (Zn) and ferrite containing manganese (Mn) and zinc (Zn). The material of the magnetic core 50 can be selected as appropriate according to the frequency band of electromagnetic noise to be reduced, for example.

As shown in FIG. 3, the magnetic core 50 in this embodiment is formed continuously over the entire circumference of the magnetic core 50 in the circumferential direction, and has a closed ring shape. That is, a slit, which extends in the axial direction of the magnetic core 50, is not formed in the magnetic core 50 in this embodiment. The magnetic core 50 in this embodiment is composed of one component. Note that although the magnetic core 50 is composed of one component in this embodiment, the magnetic core 50 may be formed by combining multiple core members into a ring shape. The magnetic core 50 may be formed in a circular ring shape by combining two core members that have semicircular transverse cross-sections, for example.

As shown in FIG. 4, the magnetic core 50 has an outer circumferential surface 50A extending in the circumferential direction and the axial direction of the magnetic core 50, and two side surfaces 50B that are located at the two ends in the axial direction of the magnetic core 50 and extend in the radial direction of the magnetic core 50, for example. The two side surfaces 50B are provided between the outer circumferential surface 50A and the inner circumferential surface of the through-hole 51, for example. The dimension of the outer circumference of the magnetic core 50 is set larger than the dimension of the outer circumference of the outer cover members 25 and 35, for example.

Configuration of Case 60

The case 60 has a ring shape due to having the through-hole 61, for example. The case 60 has a ring shape in which two ends of the case 60 in the length direction of the wires 21 are open, for example. The case 60 in this embodiment has a circular ring shape. The through-hole 61 is formed so as to pass through the case 60 in the length direction, for example. The outer cover member 25 is provided so as to pass through the through-hole 61 in a state in which the outer cover member 25 collectively encloses the outer circumference of the plurality of wires 21, for example. The outer cover member 25 in this embodiment is provided so as to pass through the through-hole 41 in the electromagnetic wave absorbing member 40 constituted by the through-holes 51 and 61.

The case 60 has a circumferential wall 62 that extends in the circumferential direction and the axial direction of the case 60, and two side walls 63 that are located at two ends in the axial direction of the case 60 and extend in the radial direction of the case 60, for example. Each side wall 63 is provided with the through-hole 61 that passes through the side wall 63 in the axial direction. Each side wall 63 has locking portions 64 that fit in the ring-shaped recesses 27 in the outer cover member 25, for example. The locking portions 64 are provided so as to be locked to ring-shaped protrusions 26 in the length direction of the outer cover member 25, for example. Due to the locking portions 64 and the ring-shaped protrusions 26 being locked to each other, it is possible to restrict the movement of the case 60 in the length direction of the outer cover member 25.

Leading end surfaces of the locking portions 64 are formed so as to be in contact with the outer circumferential surfaces of the ring-shaped recesses 27, for example. Each locking portion 64 is held by side surfaces of the ring-shaped protrusions 26 from both sides in the length direction of the wires 21, for example. The locking portion 64 faces the side surfaces of the ring-shaped protrusions 26, for example. The locking portion 64 is in contact with the side surfaces of the ring-shaped protrusions 26, for example. The locking portions 64 may be formed continuously over the entire circumference of the through-hole 61 in the circumferential direction thereof, or may be formed in a portion of the through-hole 61 in the circumferential direction, for example.

The case 60 has an accommodation portion 65 that accommodates the magnetic core 50. The accommodation portion 65 has a size large enough to be able to accommodate the magnetic core 50. The accommodation portion 65 is formed so as to be in communication with the through-hole 61, for example. The accommodation portion 65 is constituted by the space surrounded by the inner circumferential surfaces of the side walls 62 and the inner circumferential surface of the circumferential wall 63, for example. The accommodation portion 65 is formed so as to enclose the outer circumferential surface 50A of the magnetic core 50, for example. The circumferential wall 62 is formed so as to cover the outer circumferential surface 50A of the magnetic core 50, for example. The inner circumferential surface of the circumferential wall 62 is formed so as to face the outer circumferential surface 50A of the magnetic core 50, for example. The accommodation portion 65 is formed so as to enclose the side surfaces 50B of the magnetic core 50, for example. The side walls 63 are formed so as to cover the side surfaces 50B of the magnetic core 50, for example. The inner circumferential surfaces of the side walls 63 are formed so as to respectively face the side surfaces 50B of the magnetic core 50, for example.

The case 60 of this embodiment is attached to the outer circumference of the outer cover member 25 by fitting the locking portions 64 in the ring-shaped recesses 27 in the outer cover member 25 in a state in which the magnetic core 50 is accommodated in the accommodation portion 65. At this time, the magnetic core 50 is held by the accommodation portion 65 of the case 60 and the outer circumferential surface of the outer cover member 25, for example.

The case 60 may or may not have a slit extending in the axial direction of the case 60, for example. The case 60 may be constituted by one component, or may be constituted by combining multiple components.

Note that the case 60 is composed of an insulating material such as a synthetic resin, for example. It is possible to use a synthetic resin such as polyolefin, polyamide, polyester, or an ABS resin, as the material of the case 60, for example.

Configuration of Clamp 70

As shown in FIG. 2, the clamp 70 is provided on the outer circumference of the conductive path 30, out of the conductive paths 20 and 30, for example. The clamp 70 is attached to the outer circumferential surface of the outer cover member 35 (outer cover), for example.

The clamp 70 is provided in the parallel wiring portion where the conductive path 20 and the conductive path 30 are routed in parallel with each other, for example. The clamp 70 is provided in the vicinity of the electromagnetic wave absorbing member 40 in the length direction of the conductive paths 20 and 30, for example. The clamp 70 is provided away from the electromagnetic wave absorbing member 40 in the length direction of the conductive paths 20 and 30, for example. That is, the clamp 70 is provided so as not to be in contact with the electromagnetic wave absorbing member 40. The clamp 70 is provided farther away from the connector C1 than the electromagnetic wave absorbing member 40 is in the length direction of the conductive paths 20 and 30, for example.

The clamp 70 has a holding portion 71 that holds the conductive path 30 and a fixing portion 72 fixed to the vehicle body, for example. The clamp 70 is a single component in which the holding portion 71 and the fixing portion 72 are formed as a single body, for example. A resin material or a metallic material can be used as the material of the clamp 70, for example. A conductive resin material or a resin material that has no conductivity can be used as the resin material, for example. A metallic material such as an iron-based material or an aluminum-based material can be used as the metallic material, for example.

The holding portion 71 is formed so as to enclose the entire outer circumferential surface of the outer cover member 35 in the circumferential direction, for example. The holding portion 71 has a tubular shape with a size large enough to be able to fit on the outside of the outer cover member 35, for example. The holding portion 71 in this embodiment is formed in a cylindrical shape.

The fixing portion 72 is formed so as to protrude outward from the outer circumferential surface of the holding portion 71 in the radial direction of the holding portion 71, for example. The fixing portion 72 is fixed to a vehicle body panel of the vehicle V (see FIG. 1), for example. Due to the fixing portion 72 being fixed to the vehicle body panel, the conductive path 30 held by the holding portion 71 is fixed to the vehicle body.

Configuration of Clamp 80

The clamp 80 is provided on the outer circumference of the conductive path 30, out of the conductive paths 20 and 30, for example. The clamp 80 is attached to the outer circumferential surface of the outer cover member 35, for example.

The clamp 80 is provided away from the clamp 70 in the length direction of the conductive paths 20 and 30, for example. The clamp 80 is provided in the parallel wiring portion where the conductive path 20 and the conductive path 30 are routed in parallel with each other. The clamp 80 is provided in the vicinity of the electromagnetic wave absorbing member 40 in the length direction of the conductive paths 20 and 30, for example. However, the clamp 80 is provided farther away from the electromagnetic wave absorbing member 40 than the clamp 70 is. That is, the distance between the clamp 80 and the electromagnetic wave absorbing member 40 is longer than the distance between the clamp 70 and the electromagnetic wave absorbing member 40. In other words, the electromagnetic wave absorbing member 40 is provided toward the clamp 70 side, out of the clamps 70 and 80 in the length direction of the conductive paths 20 and 30. The clamp 80 is provided between the electromagnetic wave absorbing member 40 and the connector C1 in the length direction of the conductive paths 20 and 30, for example.

The clamp 80 has a holding portion 81 that holds the conductive path 30 and a fixing portion 82 fixed to the vehicle body, for example. The clamp 80 is a single component in which the holding portion 81 and the fixing portion 82 are formed as a single body, for example. A resin material or a metallic material can be used as the material of the clamp 80, for example. A conductive resin material or a resin material that has no conductivity can be used as the resin material, for example. A metallic material such as an iron-based material or an aluminum-based material can be used as the metallic material, for example.

The holding portion 81 is formed so as to enclose the entire outer circumferential surface of the outer cover member 35 in the circumferential direction, for example. The holding portion 81 has a tubular shape with a size large enough to be able to fit on the outside of the outer cover member 35, for example. The holding portion 81 in this embodiment is formed in a cylindrical shape.

The fixing portion 82 is formed so as to protrude outward from the outer circumferential surface of the holding portion 81 in the radial direction of the holding portion 81, for example. The fixing portion 82 is fixed to a vehicle body panel of the vehicle V (see FIG. 1), for example. Due to the fixing portion 82 being fixed to the vehicle body panel, the conductive path 30 held by the holding portion 81 is fixed to the vehicle body.

Configuration of Fixing Member 90

The fixing member 90 is formed so as to fix the conductive path 20 to the conductive path 30 in the region of the conductive path 20 where the electromagnetic wave absorbing member 40 is installed. Here, the "region where the electromagnetic wave absorbing member 40 is installed" in this specification refers to a region where vibration of the electromagnetic wave absorbing member can be suppressed due to the conductive path 20 being fixed to the conductive path 30. The "region where the electromagnetic wave absorbing member 40 is installed" in this specification includes a region located in the vicinity of the electromagnetic wave absorbing member 40. The conductive path 20 is integrated with the conductive path 30 due to the conductive path 20 being fixed to the conductive path 30 by the fixing member 90, for example.

The fixing member 90 is provided in the parallel wiring portion where the conductive path 20 and the conductive path 30 are routed in parallel with each other, for example. The fixing member 90 is provided so as to fix the conductive path 20 to the conductive path 30 in the vicinity of the electromagnetic wave absorbing member 40, for example. The fixing member 90 is provided between the connector C1 and the clamp 70 in the length direction of the conductive paths 20 and 30, for example. The fixing member 90 is provided between the clamp 70 and the clamp 80 in the length direction of the conductive paths 20 and 30, for example. The fixing member 90 is provided toward the clamp 70 side, out of the clamps 70 and 80 in the length direction of the conductive paths 20 and 30, for example.

The fixing member 90 is formed so as to fix the conductive path 20 to the conductive path 30 via the electromagnetic wave absorbing member 40, for example. The fixing member 90 is formed so as to fix the electromagnetic wave absorbing member 40 attached to the conductive path 20 to the conductive path 30, for example. The fixing member 90 is wound around the outer circumferential surface of the electromagnetic wave absorbing member 40 and the outer circumferential surface of the conductive path 30 so as to combine the electromagnetic wave absorbing member 40, which is attached to the conductive path 20, and the conductive path 30, which is routed in parallel with the conductive path 20, into one, for example. The fixing member 90 is formed so as to collectively enclose the outer circumference of the electromagnetic wave absorbing member 40 and the outer circumference of the conductive path 30, for example.

As shown in FIGS. 3 and 4, the fixing member 90 is formed as a result of one tape member 91 (tape) being wound around the electromagnetic wave absorbing member 40 and the outer cover member 35 of the conductive path 30, for example. The tape member 91 has an adhesive layer 92 and a cushioning layer 93 formed on an outer surface thereof, for example. It is possible to use a rubber-based adhesive, an acrylic adhesive, a silicone-based adhesive, or a urethane-based adhesive as the adhesive layer 92, for example. The cushioning layer 93 is formed as a single body with the adhesive layer 92, for example. The cushioning layer 93 has more excellent impact absorption properties and cushioning properties than the electromagnetic wave absorbing member 40, for example. The cushioning layer 93 has more excellent impact absorption properties and cushioning properties than the outer cover member 25, for example. The cushioning layer 93 has more excellent sound absorbency than the electromagnetic wave absorbing member 40, for example. The cushioning layer 93 has more excellent sound absorbency than the outer cover member 25, for example. It is possible to use a cloth layer constituted by a polyethylene terephthalate non-woven fabric or the like as the cushioning layer 93, for example. It is possible to use a resin layer composed of resin foam as the cushioning layer 93, for example. The foam structure of the resin foam may be an open-cell structure or a closed-cell structure. It is possible to use urethane foam, polyethylene foam, or the like as the resin foam, for example. Note that the tape member 91 may have another layer between the adhesive layer 92 and the cushioning layer 93.

The tape member 91 is wound around the outer circumferential surface of the electromagnetic wave absorbing member 40 and the outer circumferential surface of the outer cover member 35 in a state in which the adhesive layer 92 faces inward in the radial direction, for example. The adhesive layer 92 of the tape member 91 is in contact with the outer circumferential surface of the case 60 of the electromagnetic wave absorbing member 40 and is contact with the outer circumferential surface of the outer cover member 35, for example. The tape member 91 is wound continuously around the outer circumferential surface (specifically, the outer circumferential surface of the circumferential wall 62) of the case 60 and the outer circumferential surface of the outer cover member 35, for example. As shown in FIG. 3, the tape member 91 is formed so as to extend between the outer circumferential surface of the case 60 and the outer circumferential surface of the outer cover member 35, for example. The tape member 91 is formed so as to collectively enclose the outer circumference of the case 60 and the outer circumference of the outer cover member 35, for example. The tape member 91 is formed so as to enclose the entire outer circumference of the case 60 and the entire outer circumference of the outer cover member 35 in the circumferential direction, for example.

The tape member 91 covers the outer circumferential surface of the case 60 and covers the outer circumference of the outer cover member 35, for example. The tape member 91 covers the outer circumferential surface of the case 60 and the outer circumferential surface of the outer cover member 35 so as to fasten the conductive path 20 and the conductive path 30 in a direction in which the conductive path 20 and the conductive path 30 approach each other (refers to an "approaching direction" hereinafter), for example. Due to the conductive paths 20 and 30 being fastened by the tape member 91 in the approaching direction in this manner, the electromagnetic wave absorbing member 40 is fixed to the conductive path 30, and the conductive path 20 is fixed to the conductive path 30 via the electromagnetic wave absorbing member 40. At this time, a portion of the electromagnetic wave absorbing member 40 in the circumferential direction is held by the conductive path 20 and the conductive path 30 so as to be sandwiched from both sides in the radial direction, for example. A portion of the outer circumferential surface of the case 60 is in contact with the outer circumferential surface of the outer cover member 35, for example.

The tape member 91 is wound continuously from the outer circumferential surface of the case 60 to the outer circumferential surface of the outer cover member 35, for example. The tape member 91 is wound continuously around the outer circumferential surfaces of the case 60 and the outer cover member 35 in a predetermined range in the length direction of the conductive paths 20 and 30, for example.

As shown in FIG. 4, the tape member 91 has an overlapping winding structure, for example. Here, an "overlapping winding structure" refers to a structure in which the tape member 91 is helically wound such that predetermined portions thereof in the width direction of the tape member 91 overlap each other. A half-lap winding structure is preferable as an overlapping winding structure, for example. Here, a "half-lap winding structure" refers to a structure in which the tape member 91 is helically wound such that portions thereof, which are substantially the half in the width direction of the tape member 91, overlap each other.

As shown in FIG. 2, the tape member 91 in this embodiment is not wound around the outer circumference of the clamp 70 provided in the vicinity of the electromagnetic wave absorbing member 40. That is, the tape member 91 is provided away from the clamp 70 in the length direction of the conductive paths 20 and 30.

Next, the effects of this embodiment will be described.

(1) The wire harness 10 includes the conductive path 20, the conductive path 30 provided side-by-side with the conductive path 20, the electromagnetic wave absorbing member 40 provided on a portion of the conductive path 20 in the length direction of the conductive path 20, and the fixing member 90 that fixes the conductive path 20 to the conductive path 30 in the region of the conductive path where the electromagnetic wave absorbing member 40 is installed.

According to this configuration, the conductive path 20 provided with the electromagnetic wave absorbing member 40 is fixed to the conductive path 30 by the fixing member 90 in the region where the electromagnetic wave absorbing member 40 is installed. Accordingly, the conductive path 20 and the conductive path 30 that is provided side-by-side with the conductive path 20 are integrated in the region where the electromagnetic wave absorbing member 40 is installed. Therefore, it is possible to hold the electromagnetic wave absorbing member 40 with the conductive path 20 and the conductive path 30. As a result, it is possible to more stably hold the electromagnetic wave absorbing member 40 compared to a case where the electromagnetic wave absorbing member 40 is held by only the conductive path 20. Therefore, it is possible to suppress vibration of the electromagnetic wave absorbing member 40 due to vibration caused by traveling of a vehicle, and to suppress impairment of the conductive path 20 (in particular, the wires 21) due to the vibration of the electromagnetic wave absorbing member 40.

(2) The rigidity of the conductive path 30 is set higher than the rigidity of the conductive path 20. Accordingly, the conductive path 20 can be integrated with the conductive path 30 having a high rigidity. As a result, it is possible to hold the electromagnetic wave absorbing member 40 with the conductive path 30 having high rigidity, and thus to more stably hold the electromagnetic wave absorbing member 40. Accordingly, it is possible to further suppress vibration of the electromagnetic wave absorbing member 40 due to vibration caused by traveling of a vehicle, and to further suppress impairment of the wires 21 due to the vibration of the electromagnetic wave absorbing member 40.

(3) The clamp 70 for vehicle body fixing is provided on the conductive path 30, and the fixing member 90 is provided in the vicinity of the clamp 70. Accordingly, the conductive path 20 is integrated with the conductive path 30 in the vicinity of the clamp 70. Therefore, both the conductive path 20 and the conductive path 30 can be fixed to the vehicle body by the clamp 70 provided on the conductive path 30. As a result, the number of components can be reduced compared to a case where the clamps 70 are provided on both the conductive path and the conductive path 30.

Also, even if the wiring space of the conductive path 20 is narrow and a clamp cannot be provided on the conductive path 20, for example, the conductive path 20 can be fixed to the vehicle body by the clamp 70 provided on the conductive path 30.

Furthermore, the electromagnetic wave absorbing member 40 can be more stably held by the fixing force of the clamp 70 to the vehicle body. Accordingly, it is possible to further suppress vibration of the electromagnetic wave absorbing member 40 due to vibration caused by traveling of a vehicle, and to further suppress impairment of the wires 21 due to the vibration of the electromagnetic wave absorbing member 40.

(4) The fixing member 90 for fixing the conductive path 20 to the conductive path 30 is provided between the clamp 70 and the clamp 80 in the length direction of the conductive path 20. Accordingly, the conductive path 20 is integrated with the conductive path 30 between the clamp 70 and the clamp 80. Therefore, both the conductive path 20 and the conductive path 30 can be fixed to the vehicle body by the clamps 70 and 80 provided on the conductive path 30. As a result, the number of components can be reduced, compared to a case where a pair of clamps 70 is provided on each of the conductive path 20 and the conductive path 30. Also, the electromagnetic wave absorbing member 40 can be more stably held by the fixing force of the clamps 70 and 80 to the vehicle body.

(5) The electromagnetic wave absorbing member 40 is provided between the clamp 70 and the clamp 80 in the length direction of the conductive path 20, and is provided toward the clamp 70 side, out of the clamps 70 and 80. According to this configuration, the electromagnetic wave absorbing member 40 can be provided at a position close to the point fixed by the clamp 70, and thus it is possible to more stably hold the electromagnetic wave absorbing member 40.

(6) The fixing member 90 is provided between the clamp 70 and the connector C1 in the length direction of the conductive path 20. Accordingly, the conductive path 20 is integrated with the conductive path 30 between the clamp 70 and the connector C1. Therefore, it is possible to suppress vibration of the electromagnetic wave absorbing member 40 caused by traveling of the vehicle or the like between the clamp 70 and the connector C1. Thus, it is possible to inhibit the connector C1 from being shaken due to the vibration of the electromagnetic wave absorbing member 40. As a result, it is possible to suppress impairment of the connector C1 due to the vibration of the electromagnetic wave absorbing member 40.

(7) The electromagnetic wave absorbing member 40 is provided on the outer circumference of the conductive path 20. Also, the fixing member 90 is formed so as to fix the electromagnetic wave absorbing member 40 to the conductive path 30. According to this configuration, due to the electromagnetic wave absorbing member 40 being fixed to the conductive path 30 by the fixing member 90, the conductive path 20 is fixed to the conductive path 30 via the electromagnetic wave absorbing member 40. Accordingly, the electromagnetic wave absorbing member 40 can be held by the conductive path 20 and the conductive path 30 in a state in which the electromagnetic wave absorbing member 40 is sandwiched between the conductive path 20 and the conductive path 30. As a result, it is possible to more stably hold the electromagnetic wave absorbing member 40.

(8) The fixing member 90 is formed so as to cover the outer circumferential surface of the electromagnetic wave absorbing member 40. The cushioning layer 93 is provided on the outer surface of the fixing member 90. According to this configuration, the outer circumferential surface of the electromagnetic wave absorbing member 40 is covered by the cushioning layer 93, and thus, the cushioning layer 93 can be interposed between the outer circumferential surface of the electromagnetic wave absorbing member 40 and a peripheral component thereof, for example. Accordingly, it is possible to suppress direct contact between the electromagnetic wave absorbing member 40 and the peripheral component, and thus to suppress the occurrence of abnormal noise due to contact between the electromagnetic wave absorbing member 40 and the peripheral component. Also, because the fixing member 90 has the cushioning layer 93, it is possible to further reduce the number of components compared to a case where the fixing member 90 and the cushioning layer 93 are composed of separate components.

Other Embodiments

The above-described embodiment can be modified as follows. The above-described embodiment and the following modified examples may be combined to the extent that they do not contradict each other technically.

Although the conductive path 20 is fixed to the conductive path 30 by the fixing member 90 via the electromagnetic wave absorbing member 40 in the above-described embodiment, the position where the fixing member 90 is provided is not limited thereto. There is no particular limitation on the position where the fixing member 90 is provided as long as the fixing member 90 is provided in the region of the conductive path 20 where the electromagnetic wave absorbing members 40 is installed, for example. It is preferable that the fixing member 90 is provided in the vicinity of the electromagnetic wave absorbing member 40, for example.

The fixing member 90 may be provided away from the electromagnetic wave absorbing member 40 in the length direction of the conductive paths 20 and 30, for example. The fixing member 90 in this case does not cover the outer circumferential surface of the electromagnetic wave absorbing member 40.

Figure 5:
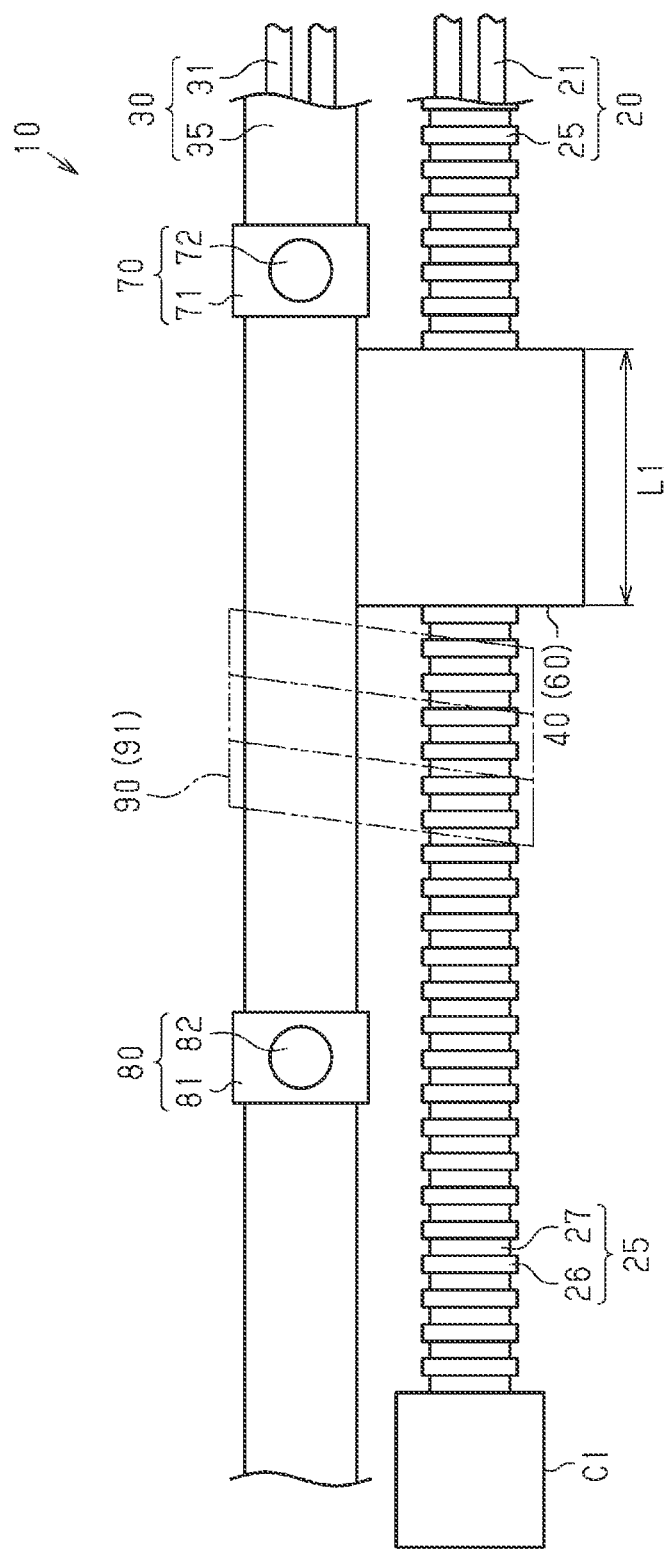
FIG. 5 is a schematic plan view showing a wire harness according to a modified example.

As shown in FIG. 5, for example, the fixing member 90 may be formed so as to fix the outer cover member 25 located away from the electromagnetic wave absorbing member 40 in the length direction of the conductive paths 20 and 30 to the outer cover member 35. The fixing member 90 in this modified example is provided between the electromagnetic wave absorbing member 40 and the clamp 80 in the length direction of the conductive paths 20 and 30. The fixing member 90 in this modified example is wound from the outer circumferential surface of the outer cover member 25 to the outer circumferential surface of the outer cover member 35 so as to combine the outer cover member 25, which is located in the vicinity of the electromagnetic wave absorbing member 40 and is exposed from the electromagnetic wave absorbing member 40, and the outer cover member 35, which is routed in parallel with the outer cover member 25, into one. Due to this fixing member 90, the outer cover member 25 is integrated with the outer cover member 35 in the vicinity of the electromagnetic wave absorbing member 40. The fixing member 90 is wound continuously around the outer circumferential surface of the outer cover member 25 and the outer circumferential surface of the outer cover member 35, for example. The fixing member 90 is formed so as to extend between the outer circumferential surface of the outer cover member 25 and the outer circumferential surface of the outer cover member 35. The fixing member 90 is formed so as to collectively enclose the outer circumference of the outer cover member 25 and the outer circumference of the outer cover member 35, for example. The fixing member 90 is formed so as to enclose the entire outer circumference of the outer cover member 25 and the entire outer circumference of the outer cover member 35 in the circumferential direction, for example.

According to this configuration, the conductive path 20 and the conductive path 30 are integrated by the fixing member 90 in the vicinity of the electromagnetic wave absorbing member 40. Accordingly, it is possible to hold the electromagnetic wave absorbing member 40 with the two conductive paths 20 and 30, and thus to stably hold the electromagnetic wave absorbing member 40.

Figure 6:
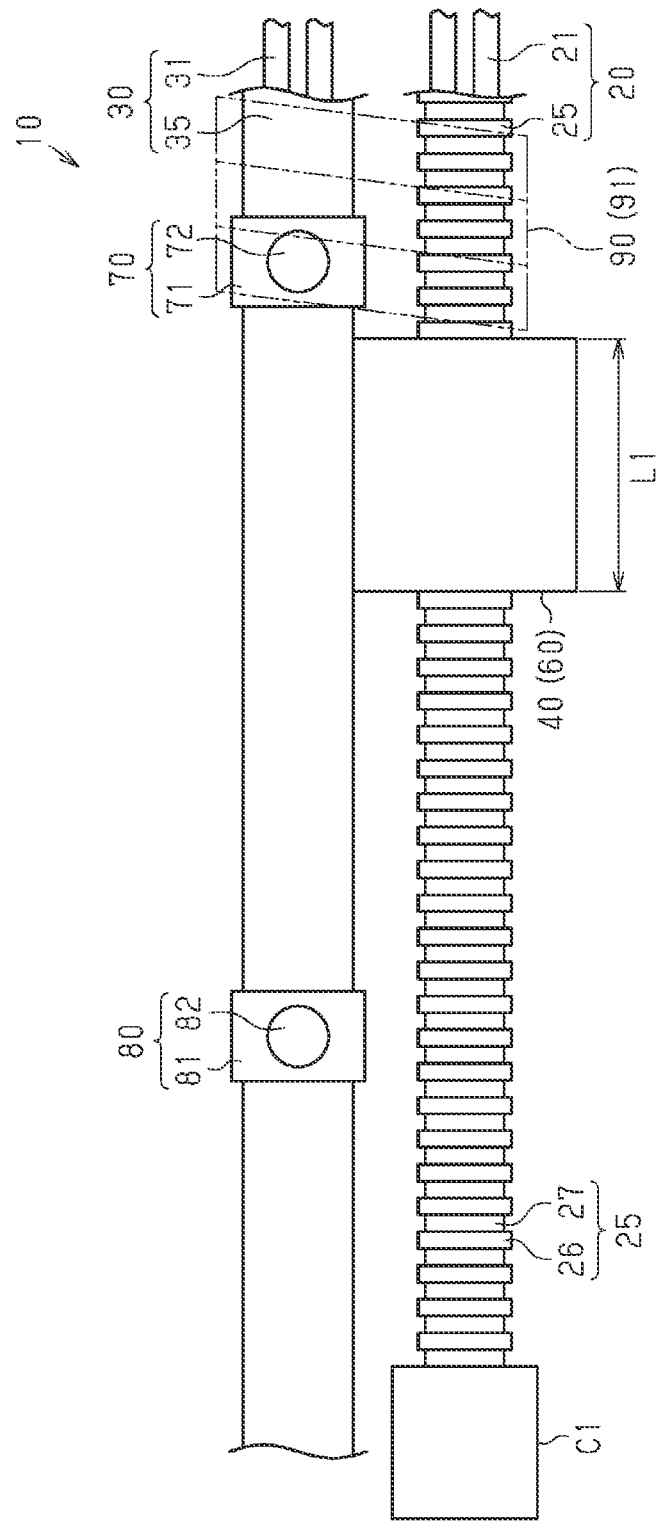
FIG. 6 is a schematic plan view showing a wire harness according to a modified example.

As shown in FIG. 6, for example, the fixing member 90 may be provided at a position where the fixing member 90 overlaps with the clamp 70 in the length direction of the conductive paths 20 and 30. The fixing member 90 in this modified example is formed so as to fix the outer cover member 25, which is located in the vicinity of the electromagnetic wave absorbing member 40 and is exposed from the electromagnetic wave absorbing member 40, to the clamp 70 and the outer cover member 35, which is located in the vicinity of the clamp 70 and is exposed from the clamp 70. The fixing member 90 is wound continuously around the outer circumferential surface of the outer cover member 25, the outer circumferential surface of the clamp 70, and the outer circumferential surface of the outer cover member 35 so as to combine the outer cover member 25, the clamp 70, and the outer cover member 35 into one, for example. Due to this fixing member 90, the outer cover member 25 is integrated with the clamp 70 and the outer cover member 35. The fixing member 90 is wound continuously around the outer circumferential surface of the outer cover member 25 and the outer circumferential surface of the clamp 70, and is wound continuously around the outer circumferential surface of the outer cover member 25 and the outer circumferential surface of the outer cover member 35, for example. The fixing member 90 is formed so as to cover the outer circumferential surface of the clamp 70, for example. However, the fixing member 90 is formed so as not to interfere with the fixing portion 72 of the clamp 70, for example. That is, the fixing member 90 is formed so as not to cover the fixing portion 72.

According to this configuration, due to the fixing member 90, the conductive path 20 and the conductive path 30 are integrated via the clamp 70 in the vicinity of the electromagnetic wave absorbing member 40. Accordingly, it is possible to hold the electromagnetic wave absorbing member 40 with the two conductive paths 20 and 30, and to hold the electromagnetic wave absorbing member 40 by the fixing force of the clamp 70 to the vehicle body. Also, the conductive paths 20 and 30 are integrated via the clamp 70, and thus both the conductive paths 20 and 30 can be suitably fixed to the vehicle body by fixing the clamp 70 to the vehicle body.

The fixing member 90 may be provided at a position where the fixing member 90 overlaps with the clamp 80 in the length direction of the conductive paths 20 and 30, for example. The fixing member 90 in this case is formed so as to fix the outer cover member 25, which is located away from the electromagnetic wave absorbing member 40, to the clamp 80 and the outer cover member 35, which is located in the vicinity of the clamp 80 and is exposed from the clamp 80.

In the above-described embodiment and the above-described modified examples, the formation range of the fixing member 90 in the length direction of the conductive paths 20 and 30 may be expanded or reduced. In the modified examples shown in FIGS. 5 and 6, for example, the formation range of the fixing member 90 in the length direction of the conductive paths 20 and 30 may be expanded to a range such that the fixing member 90 covers the outer circumferential surface of the electromagnetic wave absorbing member 40.

Although the clamp 70 is provided on the conductive path 30 in the above-described embodiment, there is no limitation thereto.

Figure 7:
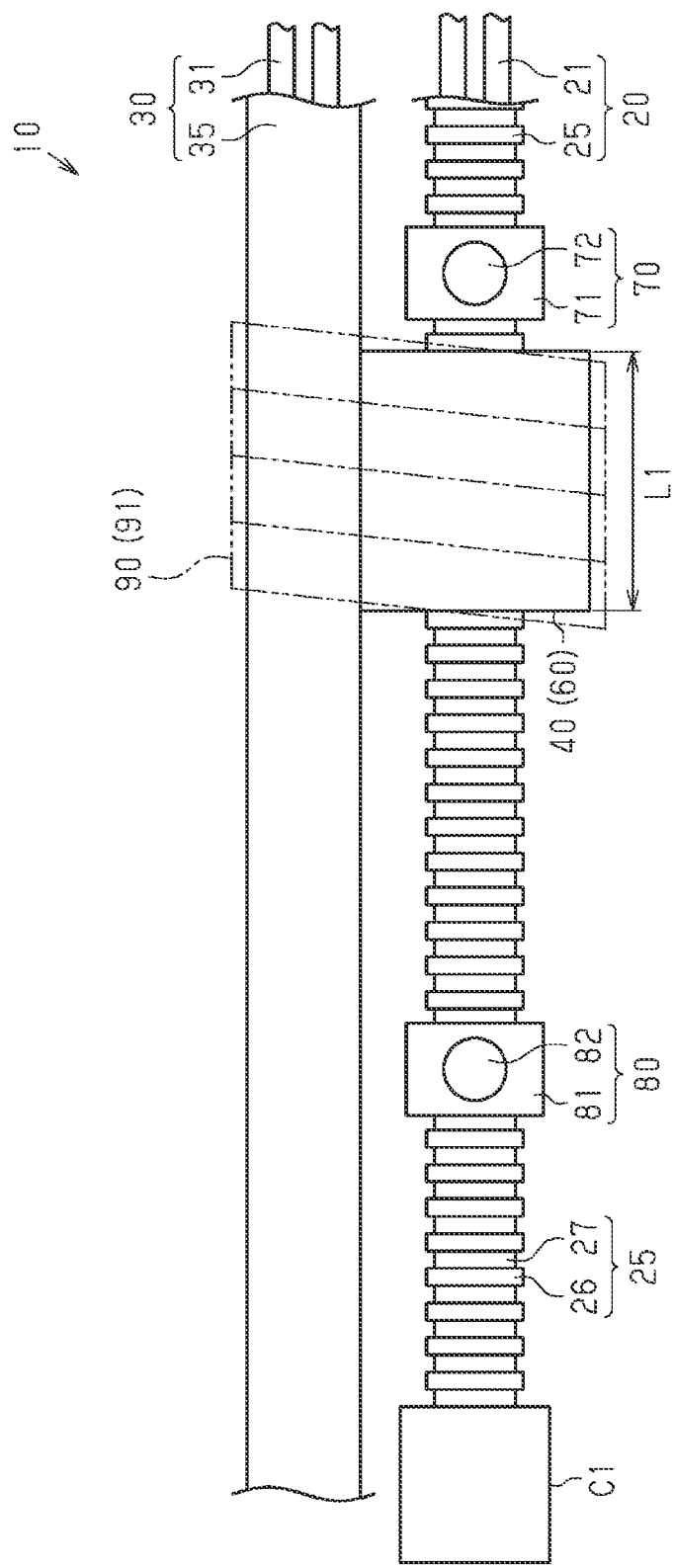
FIG. 7 is a schematic plan view showing a wire harness according to a modified example.

As shown in FIG. 7, for example, the clamp 70 may be provided on the conductive path 20. The clamp 70 may be provided on the outer circumferential surface of the outer cover member 25, for example. Even in this case, the clamp 70 is also provided in the vicinity of the electromagnetic wave absorbing member 40, for example.

Although the clamp 80 is provided on the conductive path 20 in the above-described embodiment, there is no limitation thereto.

As shown in FIG. 7, for example, the clamp 80 may be provided on the conductive path 20. The clamp 80 may be provided on the outer circumferential surface of the outer cover member 25, for example. Even in this case, the clamp 80 is provided between the electromagnetic wave absorbing member 40 and the connector C1 in the length direction of the conductive path 20, for example.

Although the clamps 70 and 80 are provided on one conductive path 30 in the above-described embodiment, there is no limitation thereto. The clamp 70 may be provided on the conductive path 30, and the clamp 80 may be provided on the conductive path 20, for example. The clamp 70 may be provided on the conductive path 20, and the clamp 80 may be provided on the conductive path 30, for example.

Although the electromagnetic wave absorbing member 40 is provided in the vicinity of the clamp 70 in the above-described embodiment, there is no limitation thereto. The electromagnetic wave absorbing member 40 may be provided in the vicinity of the clamp 80, for example. That is, the electromagnetic wave absorbing member 40 may be provided in the vicinity of the clamp 80, which is located on the side close to the connector C1, out of the clamps 70 and 80, for example.

The clamp 80 in the above-described embodiment may be omitted.

The clamp 70 in the above-described embodiment may be omitted.

The cushioning layer 93 in the tape member 91 in the above-described embodiment may be omitted.

Although the fixing member 90 is constituted by the tape member 91 in the above-described embodiment, there is no limitation thereto. A metal band or a resin cable tie can be used as the fixing member 90, for example.

Although the outer cover member 25 constituted by a corrugated tube made of a synthetic resin is used as the first outer cover member in the above-described embodiment, and the outer cover member 35 constituted by a metal pipe is used as the second outer cover member, there is no limitation thereto. The outer cover member 25 constituted by a corrugated tube made of a synthetic resin may be used as the first outer cover member, and the outer cover member 35 constituted by a corrugated tube made of a synthetic resin may be used as the second outer cover member, for example.

Although the dimension of the outer circumference of the outer cover member 35 is set larger than the dimension of the outer circumference of the outer cover member 25 in the above-described embodiment, there is no limitation thereto. The dimension of the outer circumference of the outer cover member 35 may be the same dimension as the dimension of the outer circumference of the outer cover member 25, or may be smaller than the dimension of the outer circumference of the outer cover member 25, for example.

Although the thickness of the outer cover member 35 is set larger than the thickness of the outer cover member 25 in the above-described embodiment, there is no limitation thereto. The thickness of the outer cover member 35 may be the same thickness as the thickness of the outer cover member 25, or may be smaller than the thickness of the outer cover member 25, for example.

Although the rigidity of the outer cover member 35 is set higher than the rigidity of the outer cover member 25 as a result of the outer cover member 35 being constituted by a metal pipe and the outer cover member 25 being constituted by a corrugated tube made of a synthetic resin in the above-described embodiment, there is no limitation thereto. The rigidity of the outer cover member 35 may be set higher than the rigidity of the outer cover member 25 as a result of the outer cover member 35 being constituted by a corrugated tube made of a synthetic resin and a tape member being wound around substantially the entire length of the corrugated tube in the length direction of the corrugated tube, for example. It is possible to use a corrugated tube having a slit extending in the axial direction as the outer cover member 35 in this case, for example. In this case, the above-described tape member can function to increase the rigidity of the outer cover member 35 and close the slit in the corrugated tube.

The rigidity of the conductive path 30 is set higher than the rigidity of the conductive path 20 as a result of the rigidity of the outer cover member 35 being set higher than the rigidity of the outer cover member 25 in the above-described embodiment. There is no limitation thereto, and the rigidity of the conductive path 30 may be set higher than the rigidity of the conductive path as a result of the rigidity of the wires 31 being set higher than the rigidity of the wires 21, for example.

Although the rigidity of the conductive path 30 is set higher than the rigidity of the conductive path 20 in the above-described embodiment, there is no limitation thereto. The rigidity of the conductive path 30 may be the same rigidity as the rigidity of the conductive path 20, or may be set lower than the rigidity of the conductive path 20, for example.

Although the electromagnetic wave absorbing member 40 is constituted by the magnetic core 50 and the case 60 in the above-described embodiment, there is no limitation thereto. The cushioning member may be provided between the outer circumferential surface 50A of the magnetic core 50 and the inner circumferential surface of the case 60, for example. The case 60 may be omitted, for example. In this case, the electromagnetic wave absorbing member 40 is constituted by only the magnetic core 50.

Although two wires 21 are accommodated in the outer cover member 25 in the above-described embodiment, there is no particular limitation thereto, and the number of wires 21 can be changed according to the specifications of the vehicle V. The number of wires 21 accommodated in the outer cover member 25 may be one, or three or more, for example.

Although two wires 31 are accommodated in the outer cover member 35 in the above-described embodiment, there is no particular limitation thereto, and the number of wires 31 can be changed according to the specifications of the vehicle V. The number of wires 31 accommodated in the outer cover member 35 may be one, or three or more, for example.

A wire other than the wires 31 may be accommodated in the outer cover member 35 in the above-described embodiment. The wires 21 may be accommodated in the outer cover member 35, for example. In this case, out of the wires 21 and 31 accommodated in the outer cover member 35, the wires 21 are led out from a predetermined portion of the outer cover member 35, and the wires 21 that are led out are accommodated in the outer cover member 25, for example. Also, the outer cover member 25 in which the wires 21 are accommodated is routed in parallel with the outer cover member 35 in which the wires 21 and 31 are accommodated.

Although the conductive path 20 is constituted by the wires 21 and the outer cover member 25 in the above-described embodiment, there is no limitation thereto. An electromagnetic shielding member may be provided in the outer cover member 25, for example. The electromagnetic shielding member is provided so as to collectively enclose the plurality of wires 21, for example. The electromagnetic shielding member is provided between the inner circumferential surface of the outer cover member 25 and the outer circumferential surface of the wires 21, for example. It is possible to use a flexible braided wire or metal film as an electromagnetic shielding member, for example. It is possible to use a braided wire in which multiple bare metal wires are braided, and a braided wire in which a bare metal wire and a bare resin wire are braided together, as a braided wire. A metallic material such as a copper-based material or an aluminum-based material can be used as the material of the bare metal wire, for example. It is possible to use reinforced fibers with good insulating properties and shear resistance, such as para-aramid fibers, as a bare resin wire, for example.

The outer cover member 25 may be omitted from the conductive path 20, for example. In this case, the conductive path 20 is constituted by only the wires 21, for example. In this case, the electromagnetic wave absorbing member 40 is provided on the outer circumference of the wires 21, for example.

Although the conductive path 30 is constituted by the wires 31 and the outer cover member 35 in the above-described embodiment, there is no limitation thereto. An electromagnetic shielding member may be provided in the outer cover member 35, for example. The electromagnetic shielding member is provided so as to collectively enclose the plurality of wires 31, for example. The electromagnetic shielding member is provided between the inner circumferential surface of the outer cover member 35 and the outer circumferential surface of the wires 31, for example. It is possible to use a flexible braided wire or metal film as an electromagnetic shielding member, for example.

The outer cover member 35 may be omitted from the conductive path 30, for example. In this case, the conductive path 30 is constituted by only the wires 31, for example. In this case, the fixing member 90 is provided on the outer circumference of the wires 31, for example.

The wires 21 in the above-described embodiment may be changed to shielded wires.

The wires 21 in the above-described embodiment may be changed to low-voltage wires.

The wires 31 in the above-described embodiment may be changed to shielded wires.

The wires 31 in the above-described embodiment may be changed to high-voltage wires.

There is no particular limitation on the number and installation positions of electromagnetic wave absorbing members 40 in the above-described embodiment. Two or more electromagnetic wave absorbing members 40 may be provided on the wire harness 10, for example.

The arrangement relationship of the devices M1 to M4 in the vehicle V is not limited to the above-described embodiment, and may be changed as appropriate according to the configuration of the vehicle.

The electromagnetic wave absorbing member 40 in an embodiment may be referred to as an electromagnetic noise filter attached coaxially with the first conductive path 20 at a first remote position located a first distance away from a first end of the first conductive path 20, for example, from the connector C1, in the length direction of the first conductive path 20. The fixing member 90 in an embodiment may be referred to as a loop-shaped fixing strip that fixedly bundles the first conductive path 20 and the second conductive path 30 such that the first conductive path 20 and the second conductive path 30 extend side-by-side with the electromagnetic noise filter interposed between the first conductive path 20 and the second conductive path 30.

This disclosure encompasses the following implementation examples. Not for limitation but for assistance in understanding, the reference numerals of the representative components in the representative embodiment are provided. Some of the items described in the following implementation examples may be omitted, or some of the items described in the implementation examples may be selected or extracted and combined.

[Appendix 1] A wire harness (10) according to several implementation examples of this disclosure may include:

an elongated first conductive path (20) that has a first end (C1) and a first radially outward surface (25);

an electromagnetic noise filter (40) that is attached coaxially with the first conductive path (20) at a first remote position located a first distance away from the first end (C1) of the first conductive path (20) in a length direction;

an elongated second conductive path (30) that is different from the first conductive path (20); and a loop-shaped fixing strip (90) configured to fixedly bundle the first conductive path (20) and the second conductive path (30) such that the first conductive path (20) and the second conductive path (30) extend side-by-side with the electromagnetic noise filter (40) interposed between the first conductive path (20) and the second conductive path (30).

[Appendix 2] In several implementation examples of this disclosure, the loop-shaped fixing strip (90) may be wound around the first conductive path (20) and the second conductive path (30) at the first remote position where the electromagnetic noise filter (40) is attached.

[Appendix 3] In several implementation examples of this disclosure, the electromagnetic noise filter (40) may have a proximal end that is close to the first end (C1) of the first conductive path (20) in the length direction, a distal end opposite to the proximal end in the length direction, and a length (L1) between the proximal end and the distal end, the loop-shaped fixing strip (90) may be wound around the first conductive path (20) and the second conductive path (30) at a second remote position that is located away from the first end (C1) of the first conductive path (20) in the length direction and is adjacent to the proximal end of the electromagnetic noise filter (40) (FIG. 5), or be wound around the first conductive path (20) and the second conductive path (30) at a third remote position that is located away from the first end (C1) of the first conductive path (20) in the length direction and is adjacent to the distal end of the electromagnetic noise filter (40) (FIG. 6).

[Appendix 4] In several implementation examples of this disclosure, the wire harness (10) may have a plurality of clamps for fixedly attaching the wire harness (10) to a vehicle (V), in which the plurality of clamps may include a first clamp (70) that is fixed to the first conductive path (20) or the second conductive path (30) at a first clamp position located a second distance, which is longer than the first distance, away from the first end (C1) of the first conductive path (20).

[Appendix 5] In several implementation examples of this disclosure, the plurality of clamps may include:

a second clamp (80) that is fixed to the first conductive path (20) or the second conductive path (30) at a second clamp position located a third distance, which is shorter than the first distance, away from the first end (C1) of the first conductive path (20).

[Appendix 6] In several implementation examples of this disclosure, the first conductive path (20) may include a corrugated tube (25) that provides the first radially outward surface (25) of the first conductive path (20) and a first wire (21) that is loosely inserted into the corrugated tube (25), and the second conductive path (30) may include a non-corrugated tube (35) that provides a second radially outward surface (35) of the second conductive path (30) and a second wire (31) that is loosely inserted into the non-corrugated tube (35).

[Appendix 7] In several implementation examples of this disclosure, the non-corrugated tube (35) of the second conductive path (30) may have a higher rigidity, such as a higher flexural rigidity, than the corrugated tube (25) of the first conductive path (20).

[Appendix 8] In several implementation examples of this disclosure, the first wire (21) may have a higher rigidity, such as a higher flexural rigidity, than the second wire (31).

[Appendix 9] In several implementation examples of this disclosure, the first wire (21) may be associated with a first voltage, and the second wire (31) may be associated with a second voltage that is lower than the first voltage.

[Appendix 10] In several implementation examples of this disclosure, the electromagnetic noise filter (40) may be disposed non-coaxially with the second conductive path (30).

[Appendix 11] In several implementation examples of this disclosure, the electromagnetic noise filter (40) may be in direct contact with the first radially outward surface (25) of the first conductive path (20) and the second radially outward surface (35) of the second conductive path (30).

[Appendix 12] In several implementation examples of this disclosure, the electromagnetic noise filter (40) may have a tubular shape that has a radially inward surface surrounding the entire circumference of the first radially outward surface (25) of the first conductive path (20).

[Appendix 13] In several implementation examples of this disclosure, the electromagnetic noise filter (40) may have a radially outward surface configured to be in contact with the second radially outward surface (35) of the second conductive path (30).

[Appendix 14] In several implementation examples of this disclosure, the radially inward surface of the electromagnetic noise filter (40) may have a radially inward protrusion (64) configured to engage with an outer circumferential surface (26, 27) of the corrugated tube (25), which is the first radially outward surface (25) of the first conductive path (20), and configured to position the electromagnetic noise filter (40) in the length direction of the first conductive path (20), and the radially outward surface of the electromagnetic noise filter (40) may be configured to be in surface contact with the loop-shaped fixing strip (90).

The embodiments that were disclosed here are to be considered in all aspects to be illustrative and not restrictive. The scope of the present disclosure is defined by the claims and not by the above description, and all changes that come within the meaning and range of equivalency of the claims are intended to be embraced therein.

The invention claimed is:

1. A wire harness comprising:

a first conductive path;

a second conductive path provided side-by-side with the first conductive path;

an electromagnetic wave absorber provided on a portion of the first conductive path in a length direction of the first conductive path; and a fixing member configured to fix the first conductive path to the second conductive path in a region of the first conductive path where the electromagnetic wave absorber is installed.

2. The wire harness according to claim 1, wherein the second conductive path has a higher rigidity than the first conductive path.

3. The wire harness according to claim 1, further comprising
a first clamp for vehicle body fixing that is provided on the second conductive path or the first conductive path.

4. The wire harness according to claim 3, further comprising
a second clamp that is provided on the second conductive path or the first conductive path and is provided away from the first clamp in the length direction of the first conductive path,
wherein the fixing member is provided between the first clamp and the second clamp in the length direction of the first conductive path.

5. The wire harness according to claim 4,
wherein the electromagnetic wave absorber is provided between the first clamp and the second clamp in the length direction of the first conductive path, and is provided toward a first clamp side, out of the first clamp and the second clamp.

6. The wire harness according to claim 3, further comprising
a connector connected to an end portion of the first conductive path,
wherein the fixing member is provided between the first clamp and the connector in the length direction of the first conductive path.

7. The wire harness according to claim 1, wherein:
the electromagnetic wave absorber is provided on an outer circumference of the first conductive path, and
the fixing member is formed so as to fix the electromagnetic wave absorber to the second conductive path.

8. The wire harness according to claim 1, wherein:
the fixing member is formed so as to cover an outer circumferential surface of the electromagnetic wave absorber, and
the fixing member has a cushioning layer on an outer surface thereof.

9. The wire harness according to claim 1,
wherein the fixing member is a tape having an adhesive layer.

10. The wire harness according to claim 1,
the electromagnetic wave absorber includes a ring-shaped magnetic core having a through-hole through which the first conductive path is passed, and a ring-shaped case that is configured to accommodate the magnetic core and has a through-hole through which the first conductive path is passed.

11. The wire harness according to claim 1, wherein:
the first conductive path includes one or more first wires and a first outer cover that encloses an outer circumference of the first wires,
the second conductive path includes one or more second wires and a second outer cover that encloses an outer circumference of the second wires, and
the electromagnetic wave absorber is provided on an outer circumference of the first outer cover.

* * * * *